United States Patent
Cok et al.

(10) Patent No.: US 8,520,114 B2
(45) Date of Patent: Aug. 27, 2013

(54) APPARATUS FOR DISPLAYING AND SENSING IMAGES

(75) Inventors: Ronald S. Cok, Rochester, NY (US); Andrew Arnold, Hilton, NY (US); Michael E. Miller, Xenia, OH (US); John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 280 days.

(21) Appl. No.: 13/150,807

(22) Filed: Jun. 1, 2011

(65) Prior Publication Data
US 2012/0307123 A1    Dec. 6, 2012

(51) Int. Cl.
*H04N 3/14* (2006.01)
*H04N 5/222* (2006.01)
*H04N 5/335* (2011.01)

(52) U.S. Cl.
USPC .................... 348/333.01; 348/294

(58) Field of Classification Search
USPC ............ 348/294, 302, 311, 333.01; 345/175, 345/207
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,340,978 A * | 8/1994 | Rostoker et al. | 250/208.1 |
| 6,879,098 B2 | 4/2005 | Buchwalter et al. | |
| 7,034,866 B1 * | 4/2006 | Colmenarez et al. | 348/211.12 |
| 7,068,254 B2 * | 6/2006 | Yamazaki et al. | 345/104 |
| 7,158,129 B2 * | 1/2007 | Nakajima | 345/207 |
| 7,535,468 B2 * | 5/2009 | Uy | 345/207 |
| 7,557,367 B2 | 7/2009 | Rogers et al. | |
| 7,622,367 B1 | 11/2009 | Nuzzo et al. | |
| 7,697,053 B2 * | 4/2010 | Kurtz et al. | 348/333.01 |
| 7,714,923 B2 * | 5/2010 | Cok et al. | 348/333.01 |
| 7,808,540 B2 * | 10/2010 | Cok | 348/333.01 |
| 8,223,188 B2 * | 7/2012 | Ryf et al. | 348/14.01 |
| 2006/0007222 A1 * | 1/2006 | Uy | 345/207 |
| 2006/0055864 A1 | 3/2006 | Matsumura et al. | |
| 2007/0032089 A1 | 2/2007 | Nuzzo et al. | |
| 2007/0057263 A1 | 3/2007 | Kahen | |

(Continued)

FOREIGN PATENT DOCUMENTS

| | | |
|---|---|---|
| GB | 2 464 562 A | 4/2010 |
| WO | 2004/107301 | 12/2004 |
| WO | 2010/046643 A2 | 4/2010 |

OTHER PUBLICATIONS

Ko, "A hemispherical electronic eye camera based on compressible silicon optoelectronics", Nature, vol. 454, pp. 748-753, Aug. 7, 2008, doi:10.1038/nature07113, (including Supplemental Information pp. 1-42), 2008.

(Continued)

*Primary Examiner* — Nicholas Giles
(74) *Attorney, Agent, or Firm* — Global OLED Technology LLC

(57) ABSTRACT

An apparatus for displaying and sensing images includes a display substrate and a plurality of electroluminescent pixels. A plurality of pixel control chiplets and one or more sensor chiplets are affixed to the device side of the display substrate in the display area. A transparent cover is spaced apart from and affixed to the device side of the display substrate, and has a plurality of imaging lenses formed on or in it, each imaging lens spaced apart from and corresponding to an image sensor array in a sensor chiplet for forming an imaging plane on the corresponding image sensor array.

37 Claims, 9 Drawing Sheets

(56) References Cited

U.S. PATENT DOCUMENTS

| | | |
|---|---|---|
| 2008/0106591 A1* | 5/2008 | Border et al. .............. 348/14.01 |
| 2008/0106628 A1* | 5/2008 | Cok et al. ................. 348/333.01 |
| 2008/0106629 A1* | 5/2008 | Kurtz et al. .............. 348/333.01 |
| 2008/0165267 A1* | 7/2008 | Cok ........................ 348/333.01 |
| 2009/0146967 A1 | 6/2009 | Ino et al. |
| 2009/0199960 A1 | 8/2009 | Nuzzo et al. |
| 2010/0039030 A1 | 2/2010 | Winters et al. |
| 2010/0066800 A1* | 3/2010 | Ryf et al. ................... 348/14.01 |
| 2010/0123268 A1 | 5/2010 | Menard |
| 2010/0201275 A1 | 8/2010 | Cok et al. |
| 2011/0102413 A1 | 5/2011 | Hamer et al. |

OTHER PUBLICATIONS

International Application No. PCT/US2011/046576; International Search Report and and Written Opinion dated Jan. 25, 2012.

* cited by examiner

APPARATUS FOR DISPLAYING AND SENSING IMAGES

CROSS REFERENCE TO RELATED APPLICATIONS

Reference is made to commonly-assigned, co-pending U.S. patent application Ser. No. 12/191,478, filed Aug. 14, 2008, entitled "OLED device with embedded chip driving" by Winters et al and to commonly-assigned co-pending U.S. patent application Ser. No. 12/608,049, filed Oct. 29, 2009, entitled "ACTIVE MATRIX ELECTROLUMINESCENT DISPLAY WITH SEGMENTED ELECTRODE", the disclosures of which are incorporated herein by reference.

FIELD OF THE INVENTION

The present invention relates to apparatus for integrated capture and display that provides both image display and image capture functions.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. Pixels and sub-pixels are not distinguished herein; all light-emitting elements are called pixels. A variety of flat-panel display technologies are known, for example plasma displays, liquid crystal displays, and light-emitting diode displays.

Flat-panel display devices can be used in video communication systems. Typical commercially available systems employ a display together with an imaging device, such as a digital camera, located above or below the center of the display that communicates with a similar, remote system. Each imaging device makes an image of a person seated in front of the display. A microphone simultaneously records speech. The image and speech are sent, e.g. via the internet, computer network, or telephone network, to the remote system where the image is displayed and the speech is rendered on a speaker. In this way, two (or more) individuals can see each other on a pair of displays at the same time and communicate with each other visually and aurally from separate locations, which are remote from each other. Such video interaction enhances the communication.

It is desirable in video communication systems to have the imaging device located at the point at which the individual gazes, thus giving the impression of eye contact. This is difficult, however, since a communicating individual will tend to look at the display while addressing the remote individual, thus giving the appearance that the individual is not looking at the person to whom he or she is speaking This problem is addressed, for example in commonly-assigned US 2008/0106628 and US 2008/0106629 by providing a transparent opening in a display and locating one or more digital cameras behind the display so that an individual whose gaze is directed at the display will also gaze toward at least one camera giving the impression of eye contact with the remote individual.

Similarly, U.S. Pat. No. 7,034,866 describes a combined display-camera with interspersed display and camera elements. U.S. Pat. No. 5,340,978 describes an LCD panel and solid-state image sensor. U.S. Pat. No. 7,535,468 discloses an integrated sensing display with display elements integrated with image sensing elements. US 2009/0146967 discloses a display apparatus including a display section; a light radiating section; a plurality of light converging lenses; and a plurality of light-receiving elements. WO 2004/107301 discloses microlenses intermixed with display pixels.

In these various disclosures, the image sensors are typically located behind the display, forming a relatively thick, integrated structure with multiple, separate elements that must be assembled into a relatively complex structure. In some cases, the digital cameras employed are relatively thick to provide a suitably long optical axis providing higher-quality imaging. In other cases, a lens element is located very close to, or on, an imaging element which can deteriorate the quality of the images captured. In other cases, relatively few image sensing elements are provided, reducing the resolution of the formed images. Hence, prior art image capture and display systems typically suffer from reduced image quality (e.g. resolution and sharpness) or are thicker than can be desirable.

Light-emitting diodes (LEDs) incorporating thin films of light-emitting materials forming light-emitting elements have many advantages in a flat-panel display device and are useful in optical systems. For example, organic LED color displays include arrays of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display. It is also known to employ a white sub-pixel that does not include a color filter. A design employing an un-patterned white emitter has been proposed together with a four-color pixel comprising red, green, and blue color filters and sub-pixels and an unfiltered white sub-pixel to improve the efficiency of the device.

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

Prior-art active-matrix control elements typically comprise thin-film semiconductor materials, such as silicon, formed into transistors and capacitors through photolithographic processes. The thin-film silicon can be either amorphous or poly-crystalline. Thin-film transistors made from amorphous or polycrystalline silicon are relatively larger and have lower performance than conventional transistors made from crystalline silicon wafers. Moreover, such thin-film devices typically exhibit local or large-area non-uniformity that results in perceptible non-uniformity in a display employing such materials. While improvements in manufacturing and materials processes are made, the manufacturing processes are expensive and thin-film device performance continues to be lower than the performance of crystalline silicon devices.

Matsumura et al discuss crystalline silicon substrates used with LCD displays in US 2006/0055864. Matsumura describes a method for selectively transferring and affixing pixel-control devices made from first semiconductor substrates onto a second planar display substrate. Wiring interconnections within the pixel-control device and connections from busses and control electrodes to the pixel-control device are shown. The article "A hemispherical electronic eye camera based on compressible silicon optoelectronics" in "Nature" vol. 454 August 2008 p. 748 describes a high-performance, hemispherical electronic eye camera based on single-crystalline silicon. These disclosures, however, do not provide an integrated image capture and display apparatus.

WO2010046643 describes an optical sensor that uses chiplets.

There is a need, therefore, for improving the performance of an integrated image capture and display apparatus incorporating active-matrix light-emissive elements in a compact and robust structure having improved imaging performance.

SUMMARY OF THE INVENTION

In accordance with the present invention, there is provided an apparatus for displaying and sensing images, comprising:
a) a display substrate having a display area on a device side of the display substrate;
b) a plurality of pixels located in the display area on the device side of the display substrate, each pixel including a control electrode, a transparent electrode spaced apart from the control electrode, and at least one layer of light-emitting material located between the control electrode and the transparent electrode;
c) a plurality of pixel control chiplets, each pixel control chiplet associated with at least one pixel and having a chiplet substrate independent of the display substrate located over, and affixed to, the device side of the display substrate in the display area, each pixel control chiplet having at least one connection pad and at least one pixel control circuit;
d) wherein each pixel control circuit is electrically connected to the control electrode of the associated pixel(s) through one of the connection pads for driving the control electrode to cause the light-emitting material to emit light through the transparent electrode;
e) one or more sensor chiplets, each sensor chiplet having a chiplet substrate independent of the display substrate located over, and affixed to, the device side of the display substrate in the display area, each sensor chiplet having at least one connection pad and an image sensor array for sensing an image and forming a sensed image signal; and
f) a transparent cover spaced apart from and affixed to the device side of the display substrate having a plurality of imaging lenses formed on or in the transparent cover, each imaging lens spaced apart from and corresponding to an image sensor array for forming an imaging plane on the corresponding image sensor array.

An advantage of the present invention is that by locating lenses within or upon a transparent cover of an integrated display and image sensing apparatus, the overall thickness of the apparatus can be reduced while, at the same time, maintaining a sufficiently long optical axis to provide improved imaging quality. Fewer separate elements are required, reducing complexity and cost. A high level of circuit integration in chiplets provides improved display image quality and opportunity for high-resolution image sensor arrays, as well as a multiplicity of imaging sensor arrays that enable the capture of a variety of images and video sequences having different attributes. For example, bandwidth can be reduced by performing high-resolution captures of only the important areas of a scene and low-resolution captures of the rest of the scene. Three-dimensional information or, in some embodiments, stereo capture can be easily performed without requiring either complicated lens or mirror structures.

Figure 1:
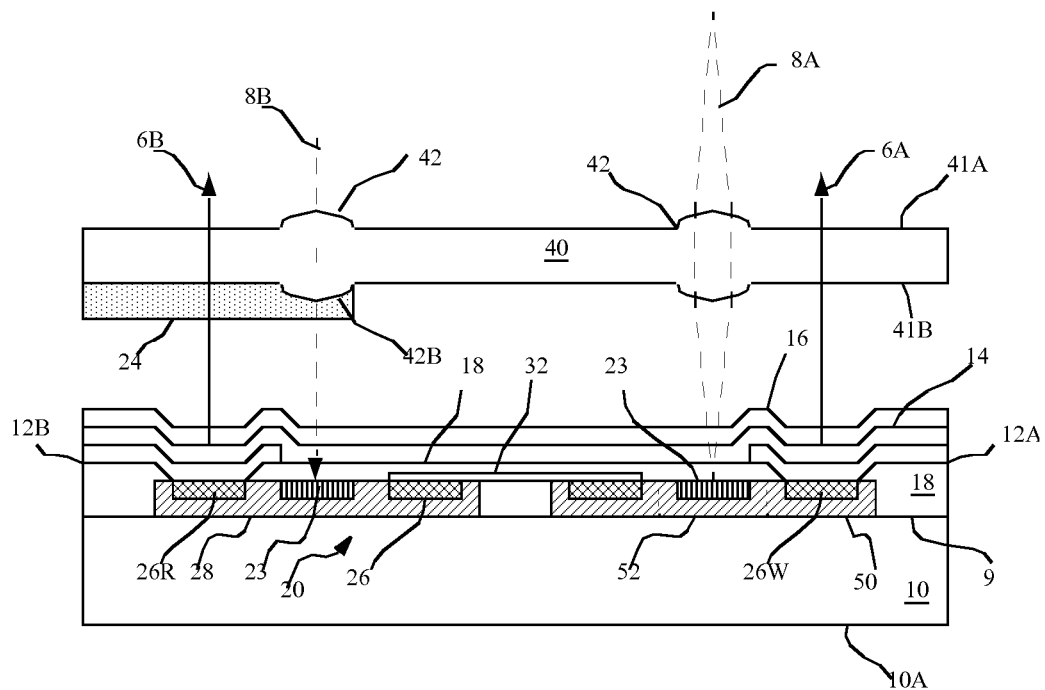
FIG. 1 is a cross section of an integrated capture and display apparatus according to an embodiment of the present invention.

Because the range of layer thicknesses in the drawings is large, the drawings are not to scale.

DETAILED DESCRIPTION OF THE INVENTION

Figure 2:
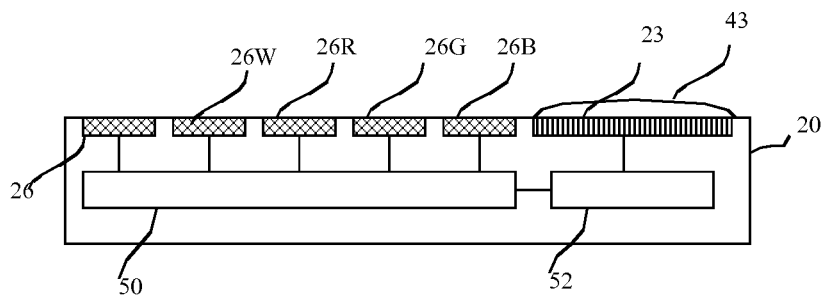
FIG. 2 is a schematic cross section of an integrated capture and display apparatus according to an embodiment of the present invention.
Figure 3:
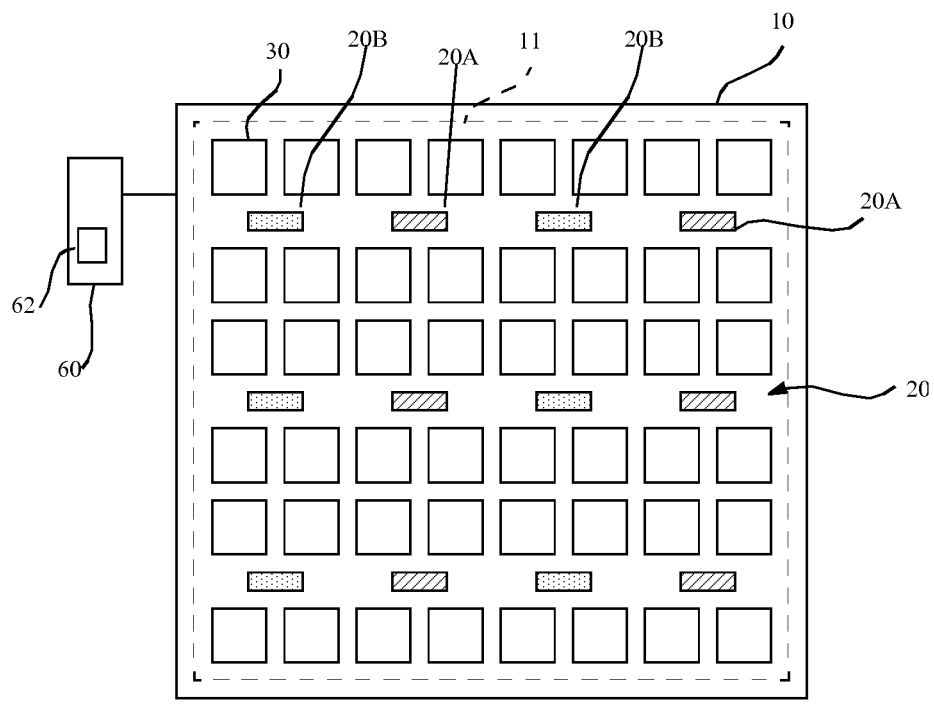
FIG. 3 is a top view of an integrated capture and display apparatus according to an embodiment of the present invention.

Referring to FIGS. 1-3, an apparatus for displaying and sensing images comprises a display substrate 10 having a display area 11 on a device side 9 of the display substrate 10.

A plurality of pixels 30 (FIG. 3) is located in the display area 11 on the device side 9 of the display substrate 10, each pixel 30 (FIG. 3) including a control electrode 12A, 12B spaced apart from a transparent electrode 16, and at least one layer 14 of light-emitting material located between the control electrode 12A, 12B and the transparent electrode 16. A plurality of chiplets 20 each providing pixel control, to at least one pixel and having a chiplet substrate 28 independent of the display substrate 10 is located over, and affixed to, the device side 9 of the display substrate 10 in the display area 11, each chiplet 20 providing pixel control having at least one connection pad 26 and at least one pixel control circuit 50. The pixel control circuit 50 (FIG. 2) is electrically connected to the control electrode 12A, 12B of the associated pixel(s) through a connection pad 26 for driving the control electrode 12A, 12B causing the layer 14 of light-emitting material to emit light 6A, 6B through the transparent electrode 16. One or more sensor arrays 23 can be formed in the chiplets 20 (FIGS. 1 and 2). Alternatively, separate sensor chiplets 20B having sensor arrays can be used (FIG. 3), each sensor chiplet 20B having a chiplet substrate 28 independent of the display substrate 10 and the pixel control chiplets located over, and affixed to, the device side 9 of the display substrate 10 in the display area 11. Each sensor chiplet 20B includes at least one connection pad 26, and an image sensor array 23 for sensing an image and forming a sensed image signal. An image sensor circuit 52 can be included to perform image processing operations on the sensed image or sensed image signal.

A transparent cover 40 (FIG. 1) having a top side 41A and an opposing bottom side 41B closer to the sensor than the top side is spaced apart from and affixed to the device side 9 of the display substrate 10 having a plurality of imaging lenses 42 formed on or in the transparent cover 40, each imaging lens 42 spaced apart from and corresponding to an image sensor array 23 for forming an imaging plane on the corresponding image sensor array 23. Planarization and insulating layers 18 can embed the chiplets 20 and provide a smooth surface for forming the electrodes (12A, 12B, 16) and light-emitting layer 14. The electrodes 12A, 12B can be reflective and formed, for example, of metal while the common electrode 16 can be transparent and formed, for example, of a metal oxide such as indium tin oxide or aluminum zinc oxide.

In embodiments of the present invention, the planarization and insulating layers 18 will be formed from a material having an index of refraction below 2 and preferably below 1.6. The sensor chiplets will typically be formed from crystalline silicon with an index of refraction greater than 3. In embodiments of the present invention, the index of refraction of the planarization and insulating layers will be less, preferably substantially less, than the index of refraction of the front surface of the sensor chiplet in the area of the image sensor array 23. In these embodiments, light will be emitted by the light-emitting layers and trapped within the display device so that it travels laterally through the substrates, light-emitting layer, and other layers of the device. The large difference between the index of refraction of the planarization or insulating layers and the index of refraction of the chiplet prevents this light, which will typically impinge on the chiplet with a small angle of incidence, from being absorbed by the sensor chiplet and entering the image sensor array 23. However, if the index of refraction of the planarization and insulating layers 18 is nearly equal to the index of refraction of the sensor chiplet, light that is trapped within the planarization and insulating layers will enter the image sensor array 23 within the sensor chiplet and provide a large number of photons to the image sensor array 23, raising the noise floor and, therefore, decreasing the signal to noise ratio of the image sensor array 23. However, by having a large change in the index of refraction at the surface of the sensor chiplet, very little of this trapped light will enter the sensor chiplet. Because the lenses focus the light from the ambient environment onto the sensor chiplet, much of this light will impinge on the sensor chiplet with a high angle of incidence and enter the sensor chiplet to be sensed, despite this large change in the index of refraction at the surface of the sensor chiplet.

FIG. 1 is a more detailed cross section of an embodiment of the present invention, while FIG. 2 provides a simplified cross section of a chiplet 20 having both a pixel control circuit 50 and an image sensor circuit 52. FIG. 2 also illustrates an optional lenslet 43 formed over the image sensor array 23. The top view of FIG. 3 illustrates an entire image capture and display apparatus according to an embodiment of the present invention having a display area 11 surrounding the pixels 30, pixel control chiplets 20A, sensor chiplets 20B, and including a controller 60 and control circuit 62.

The connection pads 26 can electrically connect the chiplets to each other and to the external controller 60 (FIG. 3) through connection wires 32 (FIG. 1). The connection pads also connect the pixel control circuit 50 to pixel electrodes (12A, 12B), for example through connection pads 26R for driving a red pixel, 26G for driving a green pixel, 26B for driving a blue pixel, and 26W for driving a white pixel An array of such pixels forms a full-color display. A color filter 24 (FIGS. 1 and 7) can be located over the light-emitting area of each pixel 30 to filter the light emitted from the light-emitting layer 14, for example if the light emitted from the light-emitting layers is white.

Figure 4:
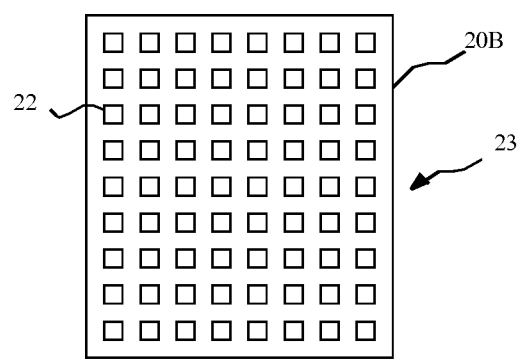
FIG. 4 is another top view of an integrated capture and display apparatus according to an embodiment of the present invention.
Figure 7:
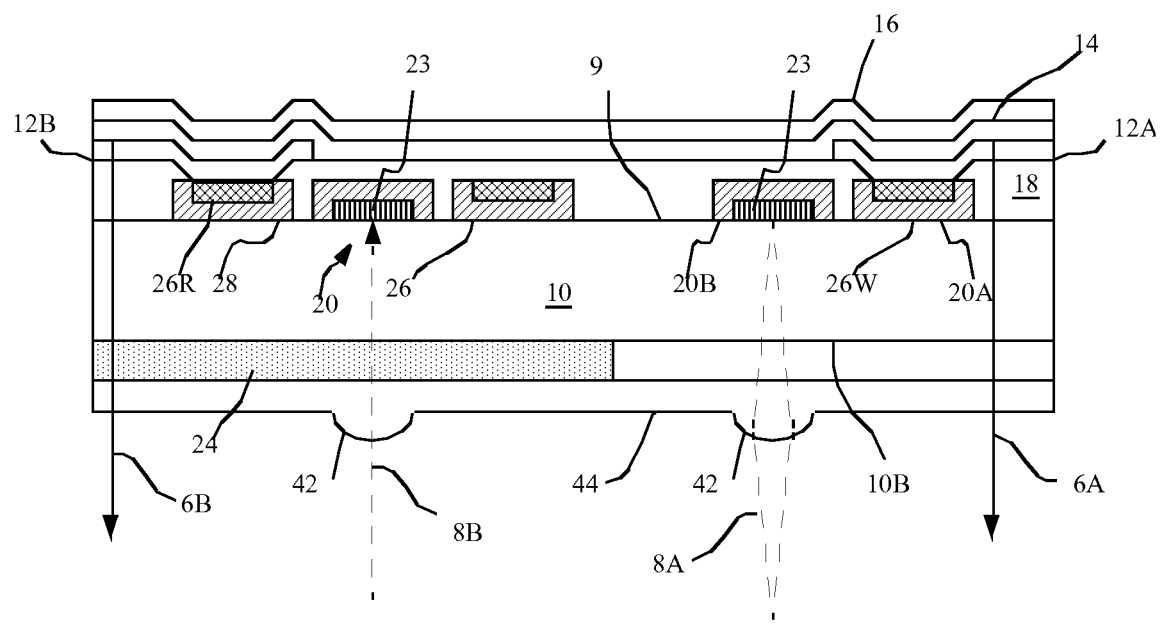
FIG. 7 is a cross section of an integrated capture and display apparatus according to an alternative embodiment of the present invention.
Figure 8:
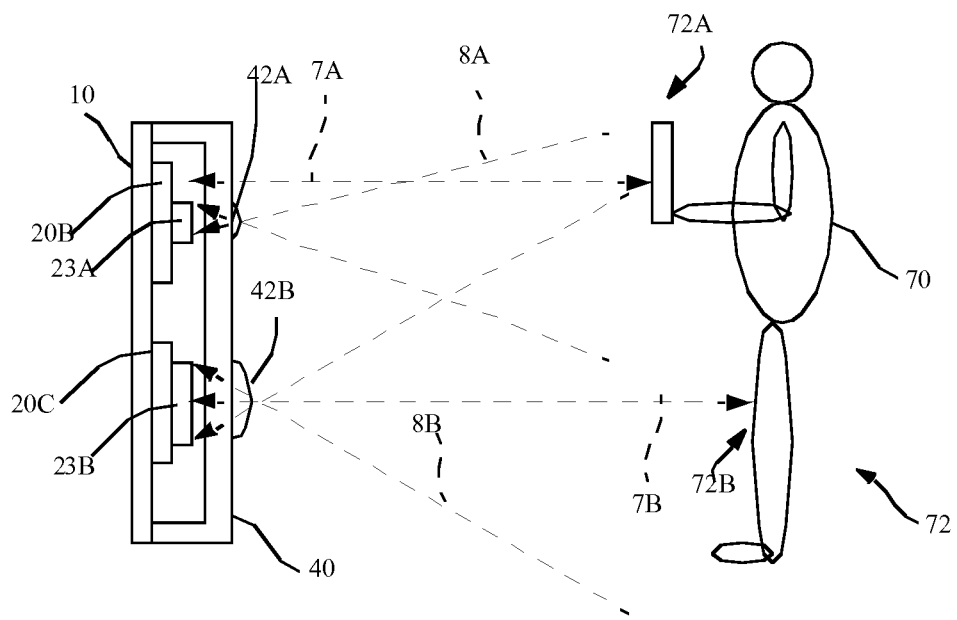
FIG. 8 is a cross section illustration of a viewer and an integrated capture and display apparatus according to an embodiment of the present invention.

The chiplet 20 can include a sensor. In such an embodiment, the pixel control circuit 50 and the image sensor circuit 52 within the chiplet 20 are formed on a common substrate 28 and within a common chiplet 20. Alternatively (as shown in FIGS. 3 and 7) a pixel control chiplet 20A can be a separate chiplet from a sensor chiplet 20B. As shown in FIG. 4, a separate sensor chiplet 20B includes an array of image sensor elements 22 forming an image sensor array 23 that can form digital images when exposed to image light 8A, 8B from a scene through imaging lenses 42 (FIG. 8). As shown in FIG. 3, the sensor chiplets 20B can be arranged in rows and columns. One of the sensor chiplets 20B can be located in a lateral sense between the two or more pixel control chiplets 20A so that the sensor chiplets 20B are intermingled in the display area 11 with the pixel control chiplets 20A. A plurality of pixel control chiplets 20A can form a first array in the display area 11 and a plurality of sensor chiplets 20B form a sensor-chiplet matrix in the display area 11 interspersed with the first array. The number of pixel control chiplets 20A can be different from the number of sensor chiplets 20B, for example there can be fewer sensor chiplets 20B than pixel control chiplets 20A. Alternatively, the pixel control chiplets can be the same chiplets 20 as the sensor chiplets.

Figure 5:
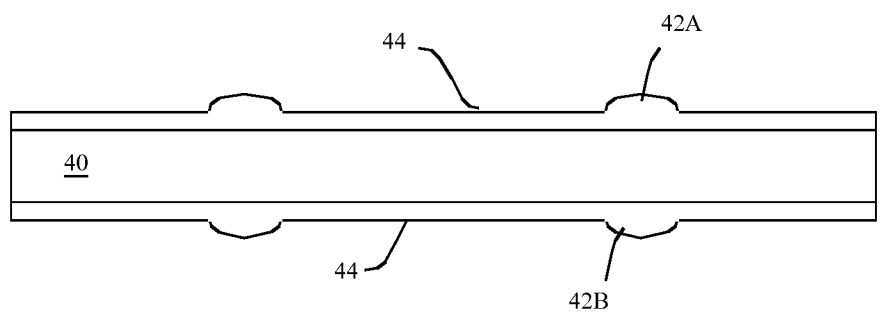
FIG. 5 is a cross section of a cover incorporating lens elements useful in an integrated capture and display apparatus according to an embodiment of the present invention.

The image lenses 42 can be molded directly into the cover 40 on either the top side 41A or bottom side 41B, or both the top side 41A and bottom side 41B. Alternatively, the image lenses 42 can be formed in a separate lens film 44 as illustrated in FIG. 5. Lens films 44 can be located either on the outside of the cover 40 (on the top side 41A of the cover opposite the light-emitting layer 14) or on the inside of the cover 40 (on the bottom side 41B of the cover 40 adjacent the light-emitting layer 14) in alignment with the image sensors arrays 23 or on both the outside of the cover 40 and the inside of the cover 40.

The chiplets 20, and in particular the image sensor arrays 23, can be arranged with the pixels 30 in the display area 11 in such a way that the visibility of the chiplets 20 and image sensor arrays 23 are reduced. The chiplets can be located laterally between pixels, for example, the control electrodes 12A, 12B can be separated within a common layer and a sensor chiplet 20 laterally located between two control electrodes 12A, 12B (as shown in FIG. 7). By laterally located is meant in a different location over the substrate 10. The sensor chiplet 20B can be within the same plane as the two control electrodes 12A, 12B, in a layer on a side of the two control electrodes 12A, 12B opposite the substrate 10 or in a layer between the two control electrodes 12A, 12B and the substrate 10. Thus, the sensor chiplet 20B can be, but is not necessarily, coplanar with the two control electrodes 12A, 12B. In any of these embodiments, a space is provided between the control electrodes 12A, 12B within the electrode layer for light to pass into the sensor chiplet 20B and so that light emitted by the organic material layer 14 is not obscured by the sensor chiplets 20B. Alternatively, at least a portion of a control electrode 12A, 12B can be partially transparent and a sensor chiplet located beneath the partially transparent portion between the substrate 10 and the control electrode 12A, 12B.

Figure 6:
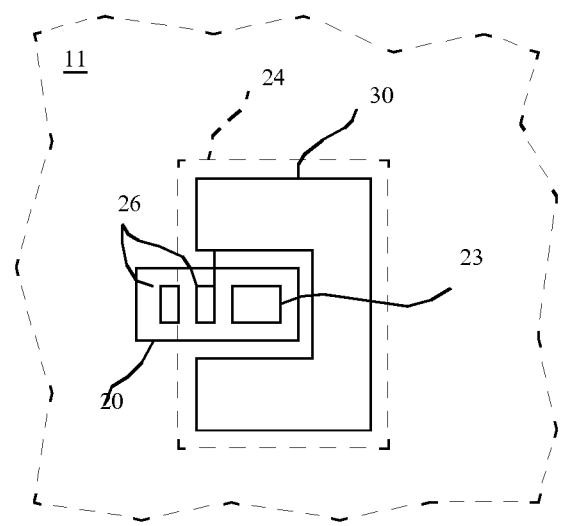
FIG. 6 is a partial schematic illustration of a pixel and chiplet layout according to an embodiment of the present invention.

In another embodiment of the integrated display and image capture apparatus of the present invention, a control electrode within the display area is positioned laterally adjacent to at least two sides of a sensor chiplet. For example, as shown in FIG. 6, the area of the pixel 30 can be adjacent to three sides of the image sensor 23 and can include chiplet connection pads 26. Such an arrangement can also have the useful effect of enabling the location of a color filter 24 over the image sensor array 23 and therefore filter the scene image light as well as the emitted light with a common filter. Alternatively, the image sensor 23 can be partially surrounded by a white pixel in an RGBW implementation having a white-light emitter so that no color filter is used. The image formed by the image sensor, therefore, can be a color image and it is not necessary to form color filters directly on the image sensor array 23 itself, thereby reducing the cost of the image sensor array 23. Multiple image sensor arrays 23 on one or more chiplets 20 can be located under different color filters 24 to form a full-color digital image.

The image sensor and pixel control circuits can be controlled so that an image is sensed when the pixels do not output light, thereby ensuring that only ambient light is used to form an image. Alternatively, the image sensor and pixel control circuits can be controlled so that an image is sensed when the pixels do output light and the captured image can be compensated to adjust for the emitted light.

As shown in FIG. 7, it is also possible to locate a lens film 44 having imaging lenses 42 on a substrate 10 side opposite the device side 9 on which the chiplets 20 are located. The chiplets 20 include the connection pads 26, 26R, 26W and so on, employed to drive the pixel electrodes 12A, 12B, for example to conduct current through the light-emitting layer 14 to a common electrode 16. In this case, the common electrode 16 can be reflective. The color filter 24 can be located on the exterior of the substrate 10 (as shown) or on a common device side 9 with the chiplets 20.

Figure 9:
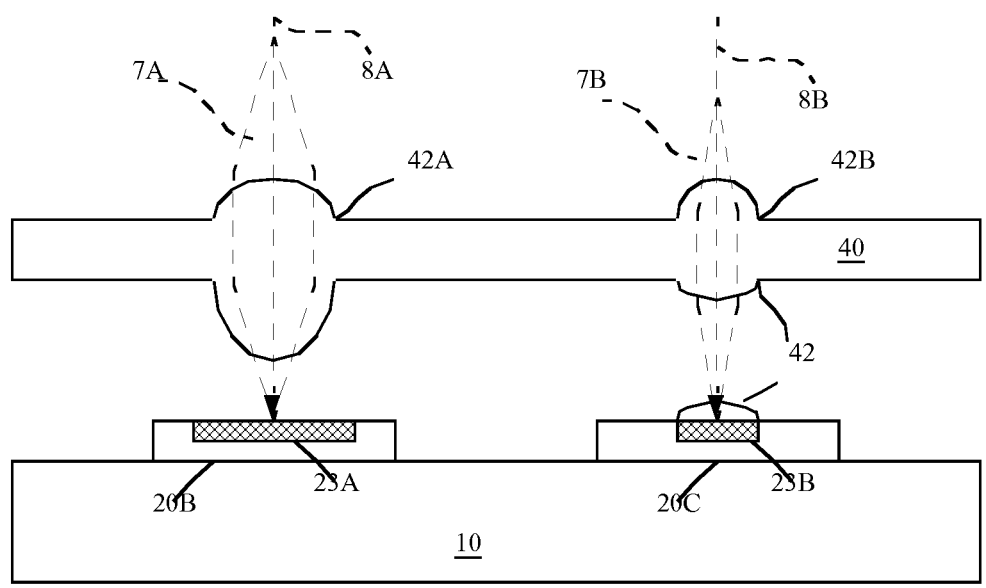
FIG. 9 is a simplified cross section of an integrated capture and display apparatus according to an embodiment of the present invention.

According to another embodiment of the present invention, when multiple image sensor arrays 23 are used, the image sensor arrays 23, or the image lenses, or both can be different. For example, as illustrated in FIGS. 8 and 9, two different chiplets 20 located on a substrate 10 can have different image sensor arrays 23A, 23B and lenses 42A, 42B. The image sensors 23A, 23B can span a range of different imaging attributes, or combinations of attributes, and can differ in size, resolution, focal length, image sensor element size, array size, bit depth, exposure time, spectral sensitivity, optical axis, focal plane, capture fields of view, magnification, light sensitivity, or any other imaging characteristics. For example, the spectral sensitivities of the image sensor array 23A, 23B can range both within and without the visible light spectrum. Different technologies can be employed in the image capture device, for example CMOS or CCD technologies as are known in the art. The lenses 42A, 42B can also differ in size, focal length, viewing angle, and any other lens characteristic. The image lenses 42A, 42B formed in lens film 44 or molded into the substrate 10 on either side of the substrate 10 can also differ to provide different desired optical paths with desired imaging characteristics for one or many different sensor chiplets. Thus, in an embodiment of the present invention, a first imaging lens and a first sensor chiplet can define a first optical path and a second sensor chiplet and a second imaging lens can define a second optical path different from the first optical path. In some embodiments, the optical elements are different or in other embodiments the number of optical elements in an optical path is different, or both the types and numbers of optical elements differ in different optical paths associated with different sensor chiplets.

In accordance with an embodiment of the present invention as shown in FIGS. 8 and 9, a first sensor chiplet 20B can form a first image of a scene on the image sensor array 23A of the first sensor chiplet 20B and the imaging lens corresponding to a second sensor chiplet 20C can form a second image different from the first image of the same scene on the image sensor array 23B of the second sensor chiplet 20C or forms a second image of a portion of the first image of the same scene on the optical sensors of the second sensor chiplet 20C. Thus, different but related images of a common scene can be produced. Alternatively, the different image sensors can form images of different scenes, for example by using non-overlapping fields of view either by controlling viewing angle, location of the image sensor on the display substrate, or by using different optical axes.

The use of multiple image sensors has advantages. The digital images formed from two image sensors can be combined to form a higher resolution digital image or a digital image with lower noise, or a stitched-together panoramic scene. In addition, by using different optical systems, different types of digital images can be formed and composite images can be formed. Different views (perspectives) of the same area or object within a scene can be formed from image sensors located at different points in a common display or on different optical axes. This enables formation of a three-dimensional image from the different-perspective images, for example by image processing circuitry provided within a chiplet or within an external computing device. Images focused at different points in a scene can be combined to form a digital image that is sharp both in the background and the foreground and the sharpness of each image can provide information regarding the distance to the points within the scene. Wide or narrow-angle images can be formed and employed as required. Images having variable resolution can be formed, for example by combining a high-resolution image of a central location within a scene and a low-resolution image of the larger scene. This can be useful in reducing bandwidth or image size by limiting the resolution of image portions to those portions requiring higher resolution.

In operation, a controller receives and processes an information signal according to the needs of the display device and transmits the processed signal and control information to each chiplet and pixel control circuit in the apparatus. The processed signal includes luminance information for each light-emitting pixel element. The luminance information can be stored in an analog or digital storage element corresponding to each light-emitting pixel element. The chiplets then activate the pixel electrodes to which they are connected. At the same time, or in response to a signal, the image sensors can be activated to form a digital image of the scene before the display. The digital image can be communicated to the controller through the same signal wires that supplied the displayed image. If more than one image is formed, each can be communicated to the controller. The controller can combine or otherwise process the images or can transfer them to a remote computing device.

The present invention has the advantage of providing both a high-performance pixel driving circuit and a high-performance image sensing device. By using chiplets, for example having a crystalline silicon substrate, very fast and small circuits can be constructed, for example for control, processing, or communication. In contrast, thin-film circuits are too large and slow to provide such advantages. Furthermore, by integrating the chiplets on the device side of the substrate on which the light-emitting pixels are formed, a common chiplet can be employed to control the pixels and to form image signals, reducing device complexity and greatly improving the integration and reducing the thickness of the apparatus. This provides both higher performance and improved robustness. An especially important feature of the present invention is the integration of the image lenses into the system. By integrating the lenses into or on the cover, a mechanically robust and very thin structure is formed. At the same time, the image lenses are spaced apart from the image sensors providing a longer optical axis, allowing the formation of higher-quality images on the image sensor arrays 23. This is in contrast to lensing systems that locate lenses directly on the image sensors, reducing image quality, or locating the sensors outside the display apparatus, increasing thickness and decreasing mechanical robustness.

Further, having high-performance pixel-driving circuits within a very large display integrated with a high-performance image sensing device provides other advantages and opportunities. In some embodiments, control signals can be provided to the pixel-driving circuits simultaneously with providing control signals to the image sensing device such that illumination conditions for the image sensing device are controlled. For example, the high-performance pixel-driving circuits can interrupt the flow of current to the light-emitting elements of the display during the time period the image sensing device is active, so that flare due to the light emitted from the light-emitting elements is reduced during image capture. Alternatively, the high-performance pixel-driving circuits can provide a very high level of illumination during the time period that the image-sensing device is active to provide greater illumination within the environment to illuminate the sensor. Either of these or other conditions can be performed simultaneously for the entire display or be performed for different areas of the display. For example, in some embodiments, the pixel-driving circuits can provide a very high level of illumination on one side of the display while the image-sensing devices on the other side of the display are active to provide specific shadow patterns or to eliminate certain imaging artifacts, such as red eye.

An image display and capture apparatus of the present invention can be created by providing a substrate, for example a glass substrate as commercially used for display devices. An adhesion layer can be formed on the substrate and chiplets printed onto the adhesion layer using processes taught, for example, in co-pending commonly-assigned U.S. patent application Ser. No. 12/191,478. The adhesion layer is then cured and a subsequent burying layer formed over the chiplet. Conventional photolithography processes can be used to form wires connected through vias to the connection pads on the chiplets. ITO or metal can be used to form electrodes, for example by sputtering or evaporation, and electrically connected to the chiplets by using photolithographic processes. Vapor deposition processes can then deposit organic layers. A top electrode, for example of metal or a metal oxide, can be deposited over the organic layers to form an organic light-emitting diode.

Additional busses, for example using connection wires 32, can supply a variety of signals, including timing (e.g. clock) signals, data signals, select signals, power connections, or ground connections. The signals can be analog or digital, for example digital addresses or data values. Analog data values can be supplied as charge or voltage. The storage registers can be digital (for example including flip-flops) or analog (for example including capacitors for storing charge).

In one embodiment of the present invention, the display device is an organic light-emitting diode (OLED) display. The controller can be implemented as a chiplet and affixed to the substrate. The controller can be located on the periphery of the substrate, or can be external to the substrate and include a conventional integrated circuit. Note also that separate controllers can be provided for providing image data to the chiplets and for obtaining and synthesizing the captured images. Controllers for synthesizing the captured images will receive image data from multiple sensor chiplets 20 and compose one or more images from this image data. This controller can further perform other useful actions with this data, including performing facial or other biometric identification, face detection, pose or field of view determination, hand and finger tracking, and gesture identification for one or more users who are positioned in front of and who are interacting with the display.

According to various embodiments of the present invention, the chiplets can be constructed in a variety of ways, for example with one or two rows of connection pads along a long dimension of a chiplet. Interconnection busses and wires can be formed from various materials and can use various methods for deposition on the device substrate. For example, interconnection busses and wires can be metal, either evaporated or sputtered, for example aluminum or aluminum alloys, magnesium, or silver. Alternatively, the interconnection busses and wires can be made of cured conductive inks or metal oxides. In one cost-advantaged embodiment, the interconnection busses and wires are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals. Individual pixel groups or multiple pixel groups can be located on tiled elements, which can be assembled to form the entire display.

According to the present invention, chiplets provide distributed pixel control circuits over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are manufactured separately from the display substrate and then applied to the display substrate. Details of these processes can be found, for example, in U.S. Pat. Nos. 6,879,098; 7,557,367; 7,622,367; US20070032089; US20090199960 and US20100123268.

The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. A plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate.

Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin- or curtain-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connections to the wiring layer provided over the chiplets once assembled onto the display substrate. The connection pads must be sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This shows that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

By organizing the sensor-chiplet matrices appropriately, in conjunction with selected optical paths for the corresponding image sensor arrays 23, a wide variety of useful applications can be addressed with the present invention.

Figure 10:
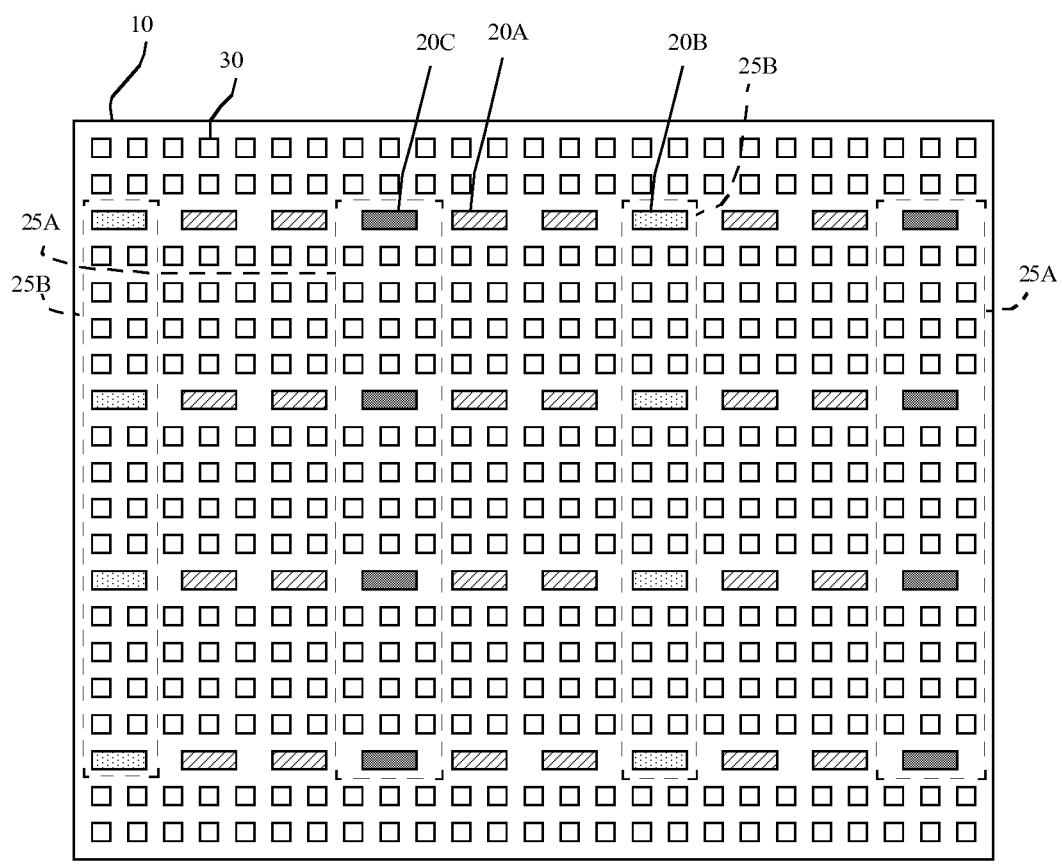
FIG. 10 is a top view of an array of pixels, an array of pixel control chiplets, and two offset sensor-chiplet matrices according to an embodiment of the present invention.

Referring to FIG. 10, in one embodiment of the present invention, the sensor chiplets are organized into two sensor-chiplet matrices 25A, 25B of sensor chiplets (e.g. 20B, 20C), each sensor chiplet having an image sensor array (e.g. 23A, 23B of FIG. 9). Sensor-chiplet matrices 25A, 25B in FIGS. 10, 11, and 13 only include the chiplets within the dashed rectangles. One of the two sensor-chiplet matrices (e.g. 25A) is laterally offset in either the row or column direction from the other sensor-chiplet matrix (e.g. 25B), permitting different images having slightly different perspectives of a common scene to be sensed. These related images comprise a stereoscopic pair.

Sensor chiplets 20B on a display substrate 10 can be arranged in first horizontal rows and first vertical columns forming a first sensor-chiplet matrix and second horizontal rows and second vertical columns of sensor chiplets 20C forming a second sensor-chiplet matrix, so that the first and second vertical columns are horizontally offset from one another. In general, the first and second columns are offset from each other in a direction not parallel to the first or second columns, e.g. perpendicular or at 45 degrees to the first and second columns where the first and second columns are parallel. The positions of rows and columns can be readily interchanged so that rows become columns and vice versa. The rows and columns can be orthogonal or non-orthogonal. The sensor chiplets 20B and 20C can be interspersed between the pixel control chiplets 20A.

Figure 11:
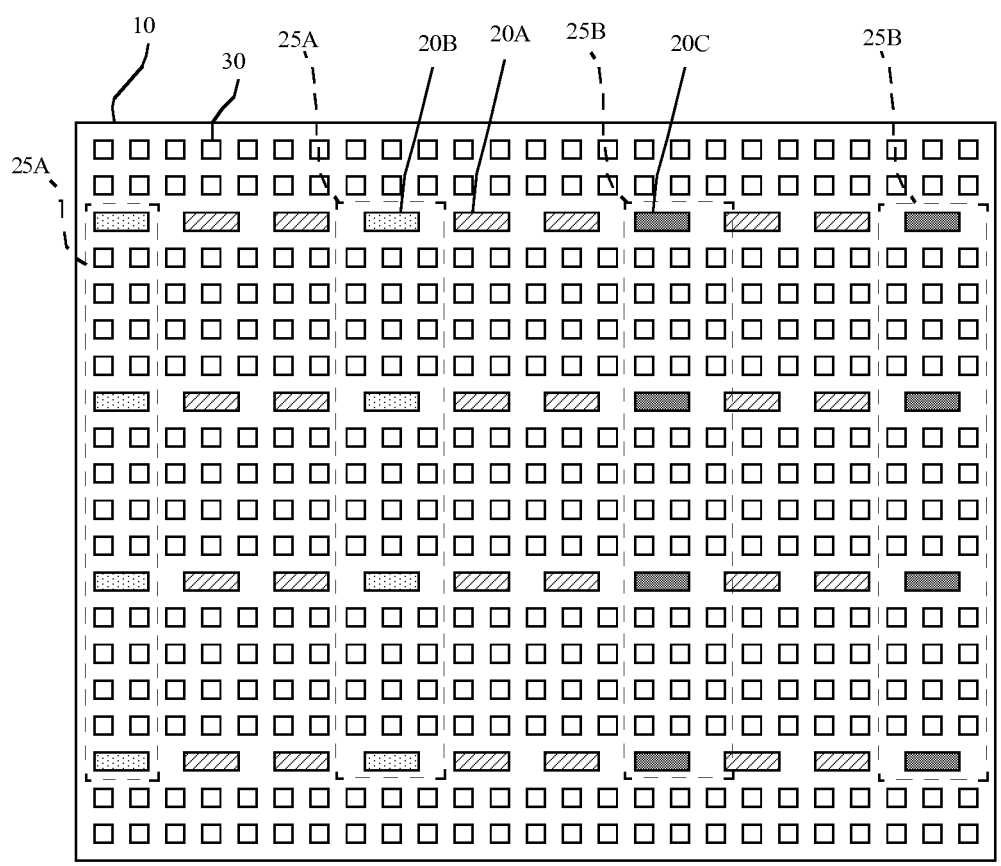
FIG. 11 is a top view of an array of pixels, an array of pixel control chiplets, and two offset sensor-chiplet matrices according to an alternative embodiment of the present invention.

Referring to FIG. 11, in another embodiment, the sensor chiplets 20B can all be laterally located to one side of the sensor chiplets 20C. In this arrangement, the sensor chiplets 20B and 20C can mimic the left and right eyes in the human head.

Because the sensor chiplets 20B have slightly different physical locations on the display substrate 10 than the sensor chiplets 20C, images sensed by the respective sensor-chiplet matrices can form a stereoscopic image pair.

In another useful application, images sensed by the respective sensor-chiplet matrices can be stitched together to form a panoramic image. The sensed images can include partially overlapped scene information. The overlap allows the overlapped images to be correctly joined and the portion of the scene that is not overlapped serves to increase the combined image size.

Figure 12:
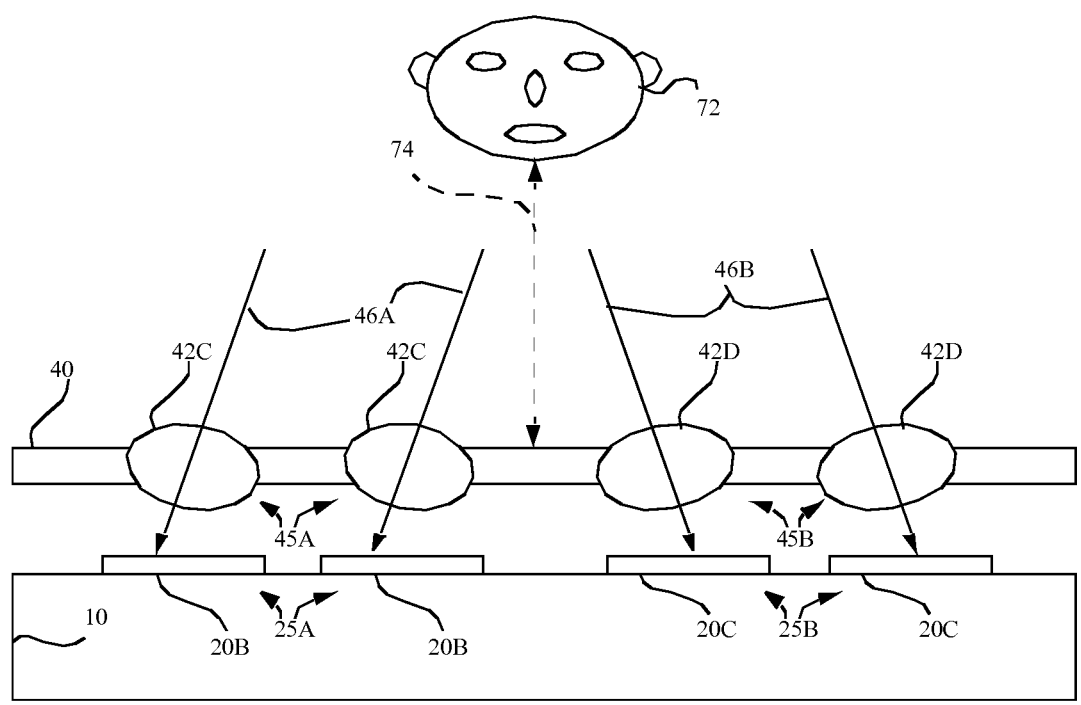
FIG. 12 is a cross section of a substrate with two sensor chiplets and a cover with imaging lenses according to an embodiment of the present invention.

The integrated imaging apparatus for displaying images while capturing images of a scene can be used in a conventional two-dimensional video-conferencing system by employing two integrated imaging apparatuses that are connected by a communication link. Images captured of a first viewer at one apparatus are communicated to the display of the other apparatus where they are viewed by a second viewer, and vice versa Referring to FIG. 12, in an embodiment of such an arrangement of imaging apparatuses, two different perspective images forming a stereoscopic image pair of the viewers can be captured by the image sensors in each display. The two images are communicated to the remote imaging display apparatus and presented alternately. The viewers wear actively-switching glasses that allow one of the two images of the stereoscopic image pair to be perceived by one eye and the other of the two images to be perceived by the other eye. In another alternative, lenticular lenses can be located over the pixels of the imaging apparatus to provide a 3D view without glasses when each image of the stereoscopic image pair is presented by the display with respect to the lenticules so as to emit light to separate eyes. Thus, the present invention can be effectively used in a 3D display and videoconferencing system.

In another embodiment of the present invention, the image display and sensing apparatus includes a selected design viewing distance 74. A first imaging lens array 45A associated with a first sensor-chiplet matrix 25A has a plurality of imaging lenses 42C, each imaging lens 42C having a first optical axis 46A. A second imaging lens array 45B associated with a second sensor-chiplet matrix 25B has a plurality of imaging lenses 42D, each imaging lens 42D having a second optical axis 46B. The respective optical axis of each imaging lens is preferably aligned to correspond to exactly one image sensor array in the corresponding sensor-chiplet matrix; e.g. each sensor chiplet has its own imaging lens. This advantageously reduces crosstalk between the interspersed sensor-chiplet matrices.

The first and second optical axes 46A, 46B intersect at the viewing distance 74 in front of the display, which is preferably between 2 and 20 feet (0.6096-6.096 m). This intersection distance is the design viewing distance 74 for the display. Through this arrangement, the stereoscopic image pair that is produced will simulate the convergence of a user's eyes at an object plane that is at the design viewing distance of the display. Different lenses can be used with different image sensor arrays to form multiple stereoscopic pairs.

Referring back to FIG. 11, in another embodiment, the imaging lenses corresponding to the image sensor arrays (not shown) of the first sensor chiplet 20B in the first sensor-chiplet matrix 25A can have a different focal length than the imaging lenses corresponding to the image sensor arrays (not shown) of the second sensor chiplet 20C in the second sensor-chiplet matrix 25B. Such differences in focal length allow the focused sensing of relatively nearer scenes with one sensor-chiplet matrix 25A and the focused sensing of relatively farther scenes with another sensor-chiplet matrix 25B.

Figure 13:
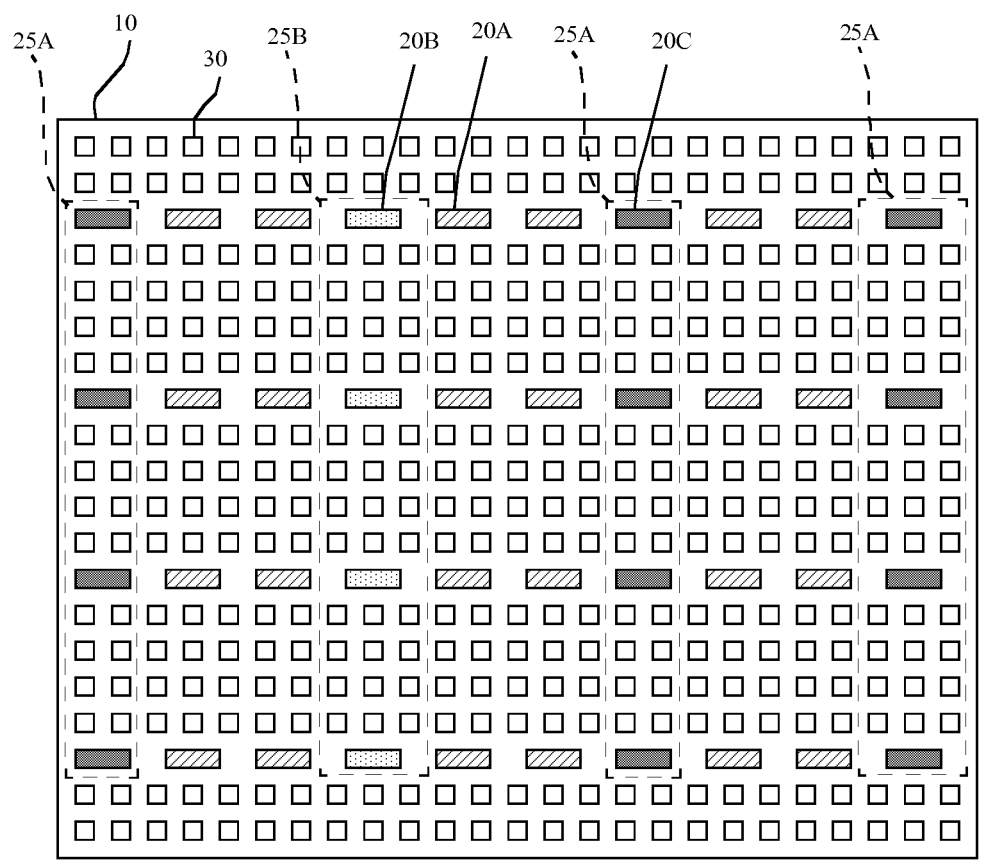
FIG. 13 is a top view of an array of pixels, an array of pixel control chiplets, and two offset sensor-chiplet matrices according to yet another alternative embodiment of the present invention.

Referring to FIG. 13, in one embodiment, the first sensor-chiplet matrix 25A has more sensor chiplets than the second sensor-chiplet matrix 25B to sense one scene at a higher resolution than the other. The number of sensor chiplets 20C on the substrate 10 between the pixel control chiplets 20A for controlling pixels 30 is greater than the number of sensor chiplets 20B.

Referring to FIG. 9, in one embodiment, the imaging lenses 42A corresponding to a first sensor-chiplet matrix (e.g. 25A, FIG. 10) have a narrower viewing angle than the imaging lenses 42B corresponding to a second sensor-chiplet matrix (e.g. 25B, FIG. 10).

In another embodiment, the sensor chiplets can sample the scene at different temporal rates, for example by acquiring images of the scene with the image sensor array at different frequencies so that the first sensor-chiplet matrices have a first image sampling rate and the second sensor-chiplet matrices have a second image sampling rate different from the first image sampling rate. This can be useful, for example, in scenes that have portions (i.e. spatially distributed areas) that change rapidly and portions that are relatively static. For example, in scenes with a high degree of gestural information, for example sign language interpretation, the hands, fingers and face of a person in the scene change rapidly, and the background changes slowly. By capturing the rapidly-changing portions of the scene at a faster image sampling rate than the more slowly-changing portions, bandwidth is reduced compared to sampling the whole scene at the faster image sampling rate, but the fidelity of the important information in the scene is preserved.

In other embodiments of the present invention, for example as shown in FIG. 10, groups of sensor chiplets are provided, the sensor chiplets in each group arranged in horizontal rows and vertical columns forming sensor-chiplet matrices 25A, 25B, where each image sensor array (not shown) senses a different frequency of light to produce differently colored frames of a multi-color image. In this arrangement, it can be useful to intersperse the sensor-chiplet matrices 25A, 25B with each other in either the horizontal or vertical direction so that, to the extent possible, the sensor-chiplet matrices 25A, 25B provide a similar scene perspective. FIG. 10 illustrates two interspersed sensor-chiplet matrices, 25A, 25B. However, more than two sensor-chiplet matrices can be used to acquire color planes for full-color images (not shown). For example, a red sensor-chiplet matrix can be more sensitive to red light, a green sensor-chiplet matrix can be more sensitive to green light, and a blue sensor-chiplet matrix can be more sensitive to blue light, respectively, than the other two of the red, green and blue sensor-chiplet matrices. "Red," "green" and "blue" can be defined various ways as known in the art. For example, "red" can refer to light having X as its highest CIE 1931 tristimulus value (i.e. greater than its Y or Z), "green" to light having Y highest, and "blue" to light having Z highest. Alternatively, "red" can refer to light with a dominant wavelength greater than 570 nm, "blue" less than 490 nm, and "green" between them.

The imaging lenses of the green sensor-chiplet matrix can have a narrower viewing angle than the imaging lenses of either the red or blue sensor-chiplet matrix or the number of sensor chiplets in the green sensor-chiplet matrix can be greater than the number of chiplets in either the red or blue sensor-chiplet matrix. In one embodiment, these features are used together. Each image sensor array in the green sensor-chiplet matrix provides a high resolution green frame of a small scene area, while each image sensor array in the red and blue sensor-chiplet matrices provides a low resolution red or blue frame of a large scene area.

In various embodiments, these two features can be used independently. In one embodiment, the number of sensor chiplets in the green sensor-chiplet matrix is the same as the numbers of sensor chiplets in the red and blue sensor-chiplet matrices, respectively, but each image sensor array in the green sensor-chiplet matrix provides a high resolution green frame of a small scene area, while each image sensor array in the red and blue sensor-chiplet matrices provides a low resolution red or blue frame of a large scene area. In another embodiment, the number of sensor chiplets in the green sensor-chiplet matrix is greater than the numbers of sensor chiplets in the red and blue sensor-chiplet matrices, respectively, and each image sensor array in the red, green and blue sensor-chiplet matrices provides a respective frame of a scene area of the same size as each other image sensor array. Using either of these features, or both together, provides improved resolution of luminance detail (which is most closely correlated with green light) at reduced bandwidth cost compared to using the same number and viewing angle of sensor chiplets in all three color arrays.

In another embodiment, fourth horizontal rows and fourth vertical columns of sensor chiplets can form a broadband sensor-chiplet matrix. The sensor chiplets of the broadband sensor-chiplet matrix can be interspersed with the sensor chiplets of the red, green, and blue sensor-chiplet matrices and can be sensitive to broadband (having two or more spectral peaks) or white light. In such a case, the imaging lenses of the broadband sensor-chiplet matrix can have a different viewing angle than the imaging lenses of the red, green or blue sensor-chiplet matrix and the number of sensor chiplets in the broadband sensor-chiplet matrix can be different from the number of chiplets in the red, green or blue sensor-chiplet matrix.

In another embodiment, for example as illustrated in FIGS. 8 and 9, a first imaging lens 42A having a first focal distance 7A is provided over a first image sensor array 23A in a first sensor chiplet 20B and a second imaging lens 42B having a second focal distance 7B is provided over a second image sensor array 23B in a second sensor chiplet 20C. The sensor chiplets, imaging lenses, and image sensor arrays can themselves be formed into arrays. In this embodiment, circuitry is provided for determining the relative sharpness of the image data captured by the first image sensor array 23A and the image data captured by the second image sensor array 23B for each pixel and then using this relative sharpness to determine the relative distance to one or more objects captured by each sensor-chiplet matrix.

For example, if the first focal distance 7A is less than the second focal distance 7B and the image data captured by the first image sensor array 23A is determined to be sharper than the image data captured by the second image sensor array 23B within a first scene area 72A of the image, the object in the scene area 72A of the image is at a distance closer to the first focal distance 7A than the second focal distance 7B. In a second scene area 72B of the same image, if the image data captured by the second image sensor array 23B is sharper than the corresponding image data captured by the first image sensor array 23A, the object in the second scene area 72B of the image is at a distance closer to the second focal distance 7B than the first focal distance 7A, and therefore farther away than objects in the first scene area 72A of the image.

Additional lenses having additional focal lengths can be employed to further differentiate distances within the scene. As shown in FIG. 9, a different lens 42A, 42B can be used for each of the image sensor arrays 23A, 23B in each sensor chiplet 20B, 20C in each sensor-chiplet matrix (not shown) or, as shown in FIG. 1, a single lens 42 can be used for the image sensor arrays 23 in multiple chiplets 20 in a particular sensor-chiplet matrix.

In another example, referring back to FIG. 8, the degree of relative sharpness can be used to approximate the distance to objects in an area of the image. That is, the relative widths of edges captured by the first and second image sensor arrays 23A, 23B can be used to approximate the distance between the focal distances 7A, 7B. For example, an object in an area of an image having an edge that is one third the width when captured with the image sensor array 23B in the second sensor chiplet 20C than when captured with the image sensor array 23A in the first sensor chiplet 20B is determined to be ¾ of the way between the first focal distance 7A and the second focal distance 7B.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. Nos. 4,769,292 and 5,061,569. Inorganic devices, for example, employing quantum dots formed in a polycrystalline semiconductor matrix (for example, as taught in US 2007/0057263, and employing organic or inorganic charge-control layers, or hybrid organic/inorganic devices can be employed. Many combinations and variations of organic or inorganic light-emitting displays can be used to fabricate such a device, including active-matrix displays having top-emitter architecture.

Further, the display device can be a traditional two-dimensional display or it can be a stereoscopic display including lenses for imaging the light-emitting elements to different locations in space as discussed, for example, in commonly-assigned co-pending docket U.S. patent application Ser. No. 12/608,049. In such an embodiment, the lenses for imaging the light-emitting elements can be formed similarly to the formation of imaging lenses 42. These lenses for imaging on the light-emitting elements can be formed in the same substrate as the imaging lens 42, and are spaced apart from and affixed to the device side 9 of the display substrate 10.

The invention has been described in detail with particular reference to certain preferred embodiments thereof, but it should be understood that variations and modifications can be effected within the spirit and scope of the invention.

PARTS LIST 6A, 6B emitted light
7A, 7B focal distance
8, 8A, 8B image light
9 display substrate device side
10 display substrate
11 display area
12A, 12B pixel control electrode
14 light-emitting layer
16 common transparent electrode
18 insulating planarization layer
20 chiplet
20A pixel control chiplet
20B sensor chiplet
20C sensor chiplet
22 image sensor element
23 image sensor array
23A, 23B image sensor array
24 color filter
25A, 25B sensor-chiplet matrix
26 chiplet connection pad
26R red pixel connection pad
26G green pixel connection pad
26B blue pixel connection pad
26W white pixel connection pad
28 chiplet substrate
30 pixel
32 connection wire
40 cover
41A cover side
41B cover side
42, 42A, 42B, 42C, 42D imaging lens
43 lenslet
44 lens film
45A, 45B imaging lens array
46A, 46B optical axis
50 pixel control circuit
52 image sensor circuit
60 controller
62 control circuit
70 individual
72 scene
72A, 72B scene area
74 viewing distance

The invention claimed is:
1. An apparatus for displaying and sensing images, comprising:
   a) a display substrate having a display area on a device side of the display substrate;

b) a plurality of pixels located in the display area on the device side of the display substrate, each pixel including a control electrode, a transparent electrode spaced apart from the control electrode, and at least one layer of light-emitting material located between the control electrode and the transparent electrode;

c) a plurality of pixel control chiplets, each pixel control chiplet associated with at least one pixel and having a chiplet substrate independent of the display substrate located over, and affixed to, the device side of the display substrate in the display area, each pixel control chiplet having at least one connection pad and at least one pixel control circuit;

d). wherein each pixel control circuit is electrically connected to the control electrode of the associated pixel(s) through one of the connection pads for driving the control electrode to cause the light-emitting material to emit light through the transparent electrode;

e) one or more sensor chiplets, each sensor chiplet having a chiplet substrate independent of the display substrate located over, and affixed to, the device side of the display substrate in the display area, each sensor chiplet having at least one connection pad and an image sensor array for sensing an image and forming a sensed image signal; and f) a transparent cover spaced apart from and affixed to the device side of the display substrate having a plurality of imaging lenses formed on or in the transparent cover, each imaging lens spaced apart from and corresponding to an image sensor array for forming an imaging plane on the corresponding image sensor array.

2. The apparatus of claim 1, wherein at least one pixel control chiplet further includes a sensor chiplet.

3. The apparatus of claim 1, wherein at least one of the sensor chiplets is laterally located between two or more of the pixel control chiplets.

4. The apparatus of claim 1, further comprising at least one color filter that filters the light emitted by at least one pixel and that filters the light sensed by at least one image sensor.

5. The apparatus of claim 1, wherein multiple sensor chiplets are arranged in rows and columns in the display area.

6. The apparatus of claim 1, wherein the transparent cover has a top side and an opposing bottom side closer to the sensor chiplet than the top side, further comprising at least one imaging lens formed in the top side or the bottom side of the transparent cover.

7. The apparatus of claim 1, wherein the transparent cover has a top side and an opposing bottom side closer to the sensor chiplet than the top side, further comprising a first film having imaging lenses formed therein located on the top side of the transparent cover or located on the bottom side of the transparent cover.

8. The apparatus of claim 7, wherein the transparent cover has a top side and an opposing bottom side closer to the sensor chiplet than the top side, further comprising a second film having imaging lenses formed therein located on the side of the cover opposite the first film.

9. The apparatus of claim 1, wherein the number of pixel control chiplets is different from the number of sensor chiplets.

10. The apparatus of claim 1, wherein the sensor chiplet is laterally located between two control electrodes.

11. The apparatus of claim 1, wherein at least a portion of a control electrode is partially transparent and a sensor chiplet is located beneath the partially transparent portion.

12. The apparatus of claim 1, wherein a control electrode within the display area is positioned laterally adjacent to at least two sides of a sensor chiplet.

13. The apparatus of claim 1, further comprising first and second imaging lenses and wherein the first imaging lens corresponding to a first sensor chiplet is different from the second imaging lens corresponding to a second sensor chiplet.

14. The apparatus of claim 13, wherein the first imaging lens has a wider viewing angle than the second imaging lens.

15. The apparatus of claim 1, wherein the image sensor array in a first sensor chiplet is different from the image sensor array in a second sensor chiplet.

16. The apparatus of claim 1, further comprising a first imaging lens, a second imaging lens, a first sensor chiplet, and a second sensor chiplet, wherein the first imaging lens and first sensor chiplet define a first optical path and the second imaging lens and second sensor chiplet define a second optical path different from the first optical path.

17. The apparatus of claim 16, wherein the first image sensor array has a different resolution, size, spectral sensitivity, optical axis, focal plane, or sensitivity than the second image sensor array.

18. The apparatus of claim 1, wherein the imaging lens corresponding to a first sensor chiplet forms a first image of a scene on the image sensor array of the first sensor chiplet and the imaging lens corresponding to a second sensor chiplet forms a second image different from the first image of the same scene on the image sensor array of the second sensor chiplet or forms a second image of a portion of the first image of the same scene on the image sensor array of the second sensor chiplet.

19. The apparatus of claim 18, wherein the first and second images include images of a common object and further comprising image processing circuitry that calculates a three-dimensional image of the common object.

20. The apparatus of claim 1, wherein the imaging lens corresponding to a first sensor chiplet forms a first image of a first scene on the image sensor array of the first sensor chiplet and the imaging lens corresponding to a second sensor chiplet forms a second image of a second scene different from the first scene on the image sensor array of the second sensor chiplet.

21. The apparatus of claim 1, further comprising a planarization layer located over the substrate and wherein the sensor chiplet is embedded in the planarization layer, the planarization layer has a first index of refraction, the front surface of the sensor chiplet has a second index of refraction, and the second index of refraction is higher than the first index of refraction.

22. The apparatus of claim 1, wherein multiple sensor chiplets are arranged in first rows and first columns forming a first sensor-chiplet matrix and second rows and second columns of sensor chiplets forming a second sensor-chiplet matrix, and wherein the first and second sensor-chiplet matrices are offset from one another in a direction not parallel to the first or second columns.

23. The apparatus of claim 22, wherein the image sensor arrays of the first sensor-chiplet matrix sense first images of scene information and the image sensor arrays of the second sensor-chiplet matrix sense second images of scene information, and the first and second images together form a stereoscopic image pair.

24. The apparatus of claim 22, wherein the image sensor arrays of the first sensor-chiplet matrix sense images of scene information that partially overlaps scene information of images sensed by the image sensor arrays of the second sensor-chiplet matrix.

25. The apparatus of claim 22, wherein the sensor chiplets of the first sensor-chiplet matrix are laterally interspersed between the sensor chiplets of the second sensor-chiplet matrix.

26. The apparatus of claim 22, wherein all of the sensor chiplets of the first sensor-chiplet matrix are laterally located to one side of the sensor chiplets of the second sensor-chiplet matrix.

27. The apparatus of claim 22, wherein the apparatus has a selected design viewing distance of between 2 and 20 feet in front of the display, further comprising:
  g) a first imaging lens array including a plurality of imaging lenses, each having a first optical axis corresponding to exactly one of the image sensor array in the first sensor-chiplet matrix;
  h) a second imaging lens array including a plurality of imaging lenses, each having a second optical axis corresponding to exactly one of the image sensor arrays in the second sensor-chiplet matrix; and
  i) wherein the first and second optical axes intersect at the design viewing distance for the display.

28. The apparatus of claim 22, wherein the imaging lenses corresponding to the image sensor arrays of the first sensor-chiplet matrix have a different focal length than the imaging lenses corresponding to the image sensor arrays of the second sensor-chiplet matrix 29. The apparatus of claim 22, wherein the first sensor-chiplet matrix has more sensor chiplets than the second sensor-chiplet matrix.

30. The apparatus of claim 29, wherein the imaging lenses of the first sensor-chiplet matrix have a narrower viewing angle than the imaging lenses of the second sensor-chiplet matrix.

31. The apparatus of claim 29, wherein the first sensor-chiplet matrices have a first image sampling rate and the second sensor-chiplet matrices have a second image sampling rate different from the first image sampling rate.

32. The apparatus of claim 1, wherein:
  a) multiple sensor chiplets are arranged in first horizontal rows and first vertical columns forming a red sensor-chiplet matrix, second horizontal rows and second vertical columns of sensor chiplets forming a green sensor-chiplet matrix, and third horizontal rows and third vertical columns of sensor chiplets forming a blue sensor-chiplet matrix, the sensor chiplets of the red, green, and blue sensor-chiplet matrices interspersed with each other in either the horizontal or vertical direction; and
  b) the image sensor arrays in the red, green and blue sensor-chiplet matrices are more sensitive to red, green and blue light, respectively, than the image sensor arrays in the other two sensor-chiplet matrices.

33. The apparatus of claim 32, wherein the imaging lenses of the green sensor-chiplet matrix have a narrower viewing angle than the imaging lenses of the red or blue sensor-chiplet matrix.

34. The apparatus of claim 32, wherein the number of sensor chiplets in the green sensor-chiplet matrix is greater than the number of chiplets in the red or blue sensor-chiplet matrix.

35. The apparatus of claim 32, further comprising fourth horizontal rows and fourth vertical columns of sensor chiplets forming a broadband sensor-chiplet matrix, the sensor chiplets of the broadband sensor-chiplet matrix interspersed with the sensor chiplets of the first, second, and third sensor-chiplet matrices, and wherein the image sensor arrays of the broadband sensor-chiplet matrix are sensitive to broadband or white light.

36. The apparatus of claim 35, wherein the imaging lenses of the broadband sensor-chiplet matrix have a different viewing angle than the imaging lenses of the red, green, or blue sensor-chiplet matrices.

37. The apparatus of claim 35, wherein the number of sensor chiplets in the broadband sensor-chiplet matrix is different than the number of chiplets in the red, green, or blue sensor-chiplet matrices.

* * * * *